US012600681B2

(12) United States Patent
Kobayashi et al.

(10) Patent No.: US 12,600,681 B2
(45) Date of Patent: Apr. 14, 2026

(54) THERMAL INSULATION MATERIAL AND METHOD FOR PRODUCING THERMAL INSULATION MATERIAL

(71) Applicant: IBIDEN CO., LTD., Gifu (JP)

(72) Inventors: Tomoya Kobayashi, Gifu (JP); Hiro Kitaguchi, Gifu (JP)

(73) Assignee: IBIDEN CO., LTD., Gifu (JP)

( * ) Notice: Subject to any disclaimer, the term of this patent is extended or adjusted under 35 U.S.C. 154(b) by 198 days.

(21) Appl. No.: 18/292,639

(22) PCT Filed: Jul. 25, 2022

(86) PCT No.: PCT/JP2022/028673
§ 371 (c)(1),
(2) Date: Jan. 26, 2024

(87) PCT Pub. No.: WO2023/008392
PCT Pub. Date: Feb. 2, 2023

(65) Prior Publication Data
US 2024/0336534 A1 Oct. 10, 2024

(30) Foreign Application Priority Data

Jul. 29, 2021 (JP) ................................. 2021-124661

(51) Int. Cl.
*C04B 35/83* (2006.01)
*C04B 35/628* (2006.01)
(Continued)

(52) U.S. Cl.
CPC ........ *C04B 35/83* (2013.01); *C04B 35/62873* (2013.01); *C04B 35/62884* (2013.01);
(Continued)

(58) Field of Classification Search
None
See application file for complete search history.

(56) References Cited

U.S. PATENT DOCUMENTS 5,891,518 A * 4/1999 Acevedo ............. C04B 41/5001
427/389.9
5,895,716 A * 4/1999 Fiala ..................... F16D 69/023
264/29.4
(Continued)

FOREIGN PATENT DOCUMENTS

JP 1-122976 A 5/1989
JP 3-65580 A 3/1991
(Continued)

OTHER PUBLICATIONS

International Search Report (PCT/ISA/210) issued on Oct. 4, 2022 by the International Searching Authority in International Patent Application No. PCT/JP2022/028673.
(Continued)

*Primary Examiner* — Seth Dumbris
(74) *Attorney, Agent, or Firm* — Sughrue Mion, PLLC

(57) ABSTRACT

A thermal insulation material having carbon fibers, the thermal insulation material containing; a covering layer containing pyrolytic carbon at a surface of the thermal insulation material; and a base layer containing carbon-based particles between the carbon fibers below the covering layer. A method for producing a thermal insulation material including: forming a base layer by impregnating a surface of a molded body containing carbon fibers with a slurry containing carbon-based particles; and forming a covering layer containing pyrolytic carbon on the base layer by applying a chemical vapor deposition method to the molded body in a CVD furnace.

11 Claims, 2 Drawing Sheets

(51) Int. Cl.

| | |
|---|---|
| *C04B 35/64* | (2006.01) |
| *C23C 16/26* | (2006.01) |
| *F16L 59/02* | (2006.01) |

(52) U.S. Cl.

CPC .. *C04B 35/62886* (2013.01); *C04B 35/62892* (2013.01); *C04B 35/64* (2013.01); *C23C 16/26* (2013.01); *F16L 59/029* (2013.01); *C04B 2235/425* (2013.01); *C04B 2235/5248* (2013.01); *C04B 2235/5252* (2013.01); *C04B 2235/5436* (2013.01); *C04B 2235/5445* (2013.01); *C04B 2235/5454* (2013.01); *C04B 2235/614* (2013.01); *C04B 2235/616* (2013.01); *Y10T 428/30* (2015.01)

(56) References Cited

U.S. PATENT DOCUMENTS 6,686,048 B1    2/2004    Arimoto et al.

| | | | | |
|---|---|---|---|---|
| 2009/0214808 A1* | 8/2009 | Kato | .................... | D04C 1/02 428/34.1 |
| 2009/0288592 A1* | 11/2009 | Kato | .................... | D04C 1/02 117/206 |
| 2009/0324887 A1* | 12/2009 | McCord | ............... | F16D 69/026 156/60 |
| 2020/0370170 A1* | 11/2020 | Tesson | ................ | C23C 16/045 |

FOREIGN PATENT DOCUMENTS

| | | |
|---|---|---|
| JP | 2000-327441 A | 11/2000 |
| JP | 2005-119962 A | 5/2005 |

OTHER PUBLICATIONS

Written Opinion (PCT/ISA/237) issued on Oct. 4, 2022 by the International Searching Authority in International Patent Application No. PCT/JP2022/028673.

\* cited by examiner

CARBON FIBER

CARBON FIBER

CARBON-BASED PARTICLE

COVERING LAYER

BASE LAYER

50μm

THERMAL INSULATION MATERIAL AND METHOD FOR PRODUCING THERMAL INSULATION MATERIAL

CROSS-REFERENCE TO RELATED APPLICATIONS

This application is a National Phase Entry of PCT International Application No. PCT/JP2022/028673 filed on Jul. 25, 2022, which claims priority to Japanese Patent Application No. 2021-124661 filed on Jul. 29, 2021, the contents of all of which are incorporated herein by reference in their respective entireties.

TECHNICAL FIELD

The present invention relates to a thermal insulation material and a method for producing a thermal insulation material.

BACKGROUND ART

A thermal insulation material using carbon fibers has a high heat resistant temperature and excellent thermal insulation performance, and is thus widely used as a thermal insulation material for high-temperature furnaces such as a single crystal pulling device and a ceramic sintering furnace.

The thermal insulation material using carbon fibers is widely used in a form of a felt, a papermaking product, or the like with a high porosity in order to prevent heat transfer through the carbon fibers. Generally, the felt is deformable, and is thus used as a member to fill an empty space or as a thermal insulation material to surround other components. On the other hand, the papermaking product has a high shape retention property, and is thus processed into a predetermined shape and used as a thermal insulation component. Note that the felt can also be used as a thermal insulation component having a good shape retention property by being compressed and then immobilized with a binder.

The thermal insulation material using carbon fibers may fall off due to oxidation in the furnace, mechanical friction, or the like, and particles may be generated. In addition, such defects may cause a decrease in thermal insulation property against radiation.

In order to solve these problems, Patent Literature 1 discloses a thermal insulation material for a single crystal pulling device, which is used for preventing heat in a heater that heats a crucible in the single crystal pulling device from transferring to the outside of a sealed main body, and the thermal insulation material is formed of a thermal insulation material base material made of a carbon fiber molded body, a film made of pyrolytic carbon, and a thermosetting resin carbide formed by heating, curing, and carbonizing a thermosetting resin as an intermediate layer between the carbon fiber molded body and the film made of pyrolytic carbon.

CITATION LIST

Patent Literature

Patent Literature 1: JP2005-119962A

SUMMARY OF INVENTION

Technical Problem

However, since the thermal insulation material disclosed in the Patent Literature 1 has the intermediate layer made of a thermosetting resin, there is a risk that the thermosetting resin penetrates the inside of the carbon fiber molded body, and a thickness that can ensure the original thermal insulation property is smaller, leading to a decrease in thermal insulation property.

The present invention provides a thermal insulation material using carbon fiber and a method for producing a thermal insulation material that can prevent generation of particles without degrading thermal insulation performance.

Solution to Problem

A thermal insulation material according to the present invention is a thermal insulation material using carbon fibers and includes:

a covering layer containing pyrolytic carbon at a surface; and a base layer containing carbon-based particles between the carbon fibers below the covering layer.

According to the thermal insulation material of the present invention, since the covering layer containing dense pyrolytic carbon covers the thermal insulation material using carbon fibers, diffusion of the carbon fibers as particles to the outside is prevented. In addition, since the base layer of the thermal insulation material contains the carbon-based particles, the covering layer containing pyrolytic carbon is prevented from entering a main body of the thermal insulation material containing carbon fibers, and a decrease in thermal insulation performance can be prevented.

The thermal insulation material according to the present invention preferably has the following aspects.

The carbon fibers are exposed at a surface of the base layer.

When the carbon fibers are exposed at the surface of the base layer, the covering layer is directly bonded to the carbon fibers. Therefore, it is possible to strengthen a bonding force between the thermal insulation material and the covering layer, making it difficult for the covering layer to peel off.

The carbon-based particles and the carbon fibers in the base layer are bonded to each other with a carbon-based adhesive.

Since the carbon-based particles and the carbon fibers are bonded to each other with the carbon-based adhesive, delamination of the base layer can be prevented and a strong bonding force can be imparted to the covering layer.

The carbon fibers constitute a mat or a papermaking product.

When the molded body is in a form of a mat or a papermaking product, the carbon fibers are randomly disposed and a distance therebetween can be ensured, so that the thermal insulation property can be improved.

The carbon-based particles are at least one kind of carbon-based particle selected from graphite, carbon black, glassy carbon particles, or milled carbon fibers.

Since the carbon-based particles such as graphite, carbon black, glassy carbon particles, or milled carbon fibers have few impurities, are carbon-based like the carbon fibers that constitute the thermal insulation material and the covering layer, and have low reactivity, generation of a decomposed gas can be prevented.

The carbon-based particles have an average particle diameter of 10 nm to 500 μm.

When the average particle diameter of the carbon-based particles is within the above range, a thin base layer can be formed between the carbon fibers, and a high level of bonding between the carbon fibers and the covering layer can be ensured in the thermal insulation material. In addition, it is possible to prevent the thickness of the base layer from being too large, which tends to increase heat conduction.

The base layer has a thickness of 10 μm to 500 μm.

When the thickness of the base layer is 500 μm or less, a decrease in thermal insulation performance can be prevented. When the thickness of the base layer is 10 μm or more, the covering layer can be prevented from penetrating the main body of the thermal insulation material.

A method for producing a thermal insulation material according to the present invention includes:

a base layer forming step of forming a base layer by impregnating a surface of a molded body of carbon fibers with a slurry containing carbon-based particles; and a CVD step of charging the molded body into a CVD furnace and forming a covering layer containing pyrolytic carbon on the base layer by a chemical vapor deposition method.

According to the method for producing a thermal insulation material of the present invention, the covering layer containing pyrolytic carbon is formed on the base layer by the CVD step. Therefore, since the covering layer containing dense pyrolytic carbon covers the thermal insulation material using carbon fibers, diffusion of the carbon fibers as particles to the outside is prevented. In addition, since in the present production method, the base layer contains the carbon-based particles by the base layer forming step, the covering layer containing pyrolytic carbon is prevented from entering a main body of the thermal insulation material containing carbon fibers, and a decrease in thermal insulation performance can be prevented.

The method for producing a thermal insulation material according to the present invention preferably has the following aspects.

In the base layer forming step, the carbon fibers are exposed at a surface.

When the carbon fibers are exposed at the surface of the base layer, the covering layer is directly bonded to the carbon fibers. Therefore, it is possible to strengthen a bonding force between the thermal insulation material and the covering layer, making it difficult for the covering layer to peel off.

In the base layer forming step, a carbon-based adhesive bonding the carbon-based particles and the carbon fibers is formed by impregnating the surface of the molded body with a solution of a carbon precursor simultaneously with or after the impregnation of the slurry, immobilizing the carbon-based particles and the carbon fibers, and carbonizing the carbon precursor.

Since the carbon-based particles and the carbon fibers are bonded to each other with the carbon-based adhesive, and a strong bonding force can be imparted to the covering layer.

The carbon fibers constitute a mat or a papermaking product.

When the molded body is in a form of a mat or a papermaking product, the carbon fibers are randomly disposed and a distance therebetween can be ensured, so that the thermal insulation property can be improved.

The carbon-based particles are at least one kind of carbon-based particle selected from graphite, carbon black, glassy carbon particles, or milled carbon fibers.

Since the carbon-based particles such as graphite, carbon black, glassy carbon particles, or milled carbon fibers have few impurities, are carbon-based like the carbon fibers that constitute the thermal insulation material and the covering layer, and have low reactivity, generation of a decomposed gas can be prevented.

The carbon-based particles have an average particle diameter of 10 nm to 500 μm.

When the average particle diameter of the carbon-based particles is within the above range, a thin base layer can be formed between the carbon fibers, and a high level of bonding between the carbon fibers and the covering layer can be ensured in the thermal insulation material. In addition, it is possible to prevent the thickness of the base layer from being too large, which tends to increase heat conduction.

The base layer has a thickness of 10 μm to 500 μm.

When the thickness of the base layer is 500 μm or less, a decrease in thermal insulation performance can be prevented. When the thickness of the base layer is 10 μm or more, the covering layer can be prevented from penetrating the main body of the thermal insulation material.

Advantageous Effects of Invention

According to the present invention, it is possible to provide a thermal insulation material capable of preventing generation of particles without degrading thermal insulation performance.

BRIEF DESCRIPTION OF DRAWINGS

FIGS. 1A to 1C show a method for producing a thermal insulation material according to an embodiment of the present invention, in which FIG. 1A shows a molded body of carbon fibers, FIG. 1B shows a molded body formed with a base layer, and FIG. 1C shows a thermal insulation material as a finished product.

DESCRIPTION OF EMBODIMENTS

Hereinafter, embodiments of the present invention will be specifically described. However, the present invention is not limited to the following embodiments, and can be modified and applied as appropriate without changing the gist of the present invention.

Figure 1A:
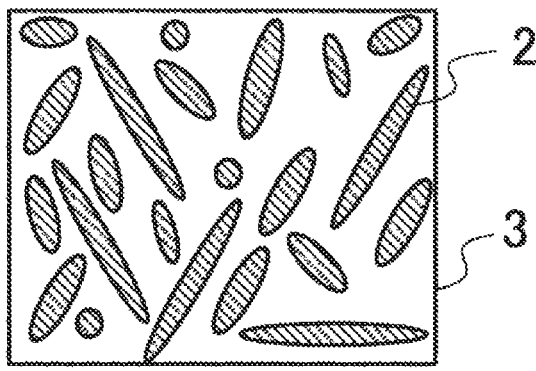
Figure 1B:
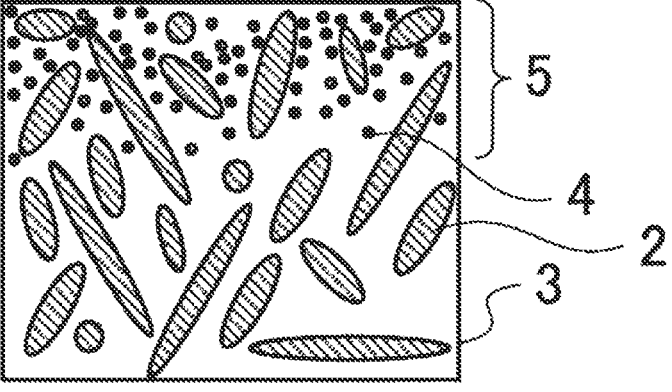
Figure 1C:
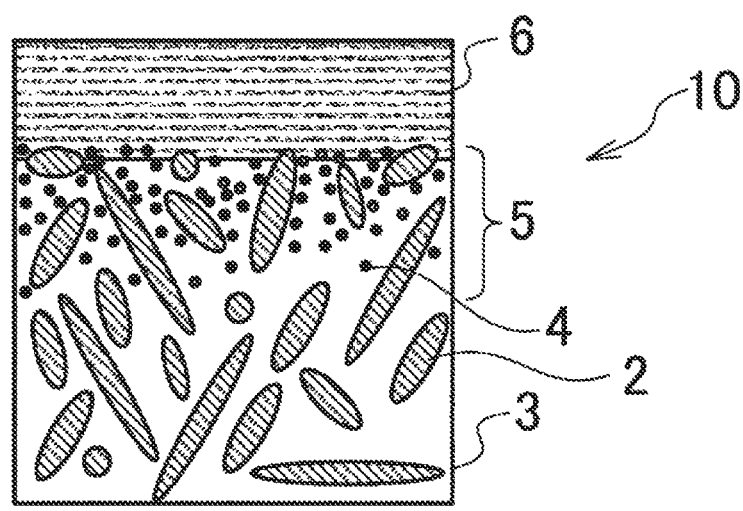

FIGS. 1A to 1C show a process for producing a thermal insulation material according to an embodiment of the present invention. As shown in FIG. 1C, the thermal insulation material according to the embodiment is a thermal insulation material 10 using carbon fibers 2 and includes a covering layer 6 containing pyrolytic carbon at a surface, and a base layer 5 containing carbon-based particles 4 between the carbon fibers 2 below the covering layer 6.

The thermal insulation material 10 is produced by a method for producing a thermal insulation material including: a base layer forming step of forming a base layer 5 FIG. 1B) by impregnating a surface of a molded body 3 of carbon fibers 2 FIG. 1A) with a slurry containing carbon-based particles 4; and a chemical vapor deposition (CVD) step of charging the molded body 3 into a CVD furnace and forming a covering layer 6 containing pyrolytic carbon FIG. 1C) on the base layer 5 by a chemical vapor deposition method.

As shown in FIG. 1A, as the molded body 3 of the carbon fibers 2, one having a form such as a mat or a papermaking product can be used. In other words, the carbon fibers 2 can constitute a mat, a papermaking product, or the like. When the molded body 3 is in a form of a mat or a papermaking product, the carbon fibers 2 are randomly disposed and a distance therebetween can be ensured, so that the thermal insulation property can be improved.

The papermaking product, which is an example of the molded body 3, can be obtained, for example, by dispersing short fibers (for example, 0.1 mm to 5 mm in length) of the carbon fibers 2 in water, and performing papermaking. A mold used for the papermaking may be flat, or may also be a curved mold having a desired shape. In the case of using a curved mold, either an inner mold or an outer mold may be used, and it is desirable to use a suction mold to prevent the papermaking product from falling from the mold.

The mat, which is an example of the molded body 3, can be obtained, for example, by laminating long fibers (for example, 10 mm to 10,000 mm in length) of the carbon fibers 2 in a form of a sheet. The obtained mat is molded into a predetermined shape and the shape is immobilized, to obtain the molded body 3. Any immobilization method can be used, such as a binder, thread stitching, or needle punching.

By further cutting the molded body 3 formed using the papermaking product and the binder, the molded body 3 can be obtained with higher shape accuracy.

The molded body has a bulk density of, for example, 0.05 g/cm³ to 0.4 g/cm³. When the bulk density is 0.05 g/cm³ or more, the molded body has certain strength as a thermal insulation material and can ensure a light blocking property, and therefore heat transfer due to radiant heat transfer can be prevented. Since carbon has a high thermal conductivity, conductive heat transfer due to carbon fibers can be prevented when the bulk density is 0.4 g/cm³ or less.

The type of the carbon fibers 2 to be used is not particularly limited, and one having a thickness of 1 μm to 20 μm can be used. When the thickness of the carbon fibers is 20 μm or less, an conductive heat transfer effect by the carbon fibers can be prevented. When the thickness of the carbon fibers is 1 μm or more, the light blocking property is excellent, and radiant heat transfer can be prevented.

The thermal insulation material 10 (molded body 3) preferably has a thickness of 3 mm to 200 mm. When the thickness is 3 mm or more, a ratio of the covering layer 6 and the base layer 5 to the entire thickness can be reduced, and the thermal insulation effect can be efficiently exhibited.

The carbon fibers 2 can be either pitch-based carbon fibers or PAN-based carbon fibers, and can also be graphitic or carbonaceous carbon fibers.

The thermal insulation material 10 as a finished product, shown in FIG. 1C, is produced through the base layer forming step and the CVD step, the base layer forming step being conducted from FIG. 1A to FIG. 1B, and the CVD step being conducted from FIG. 1B to FIG. 1C.

As shown in FIG. 1B, in the base layer forming step, the base layer 5 is formed by impregnating the surface of the molded body 3 with the slurry containing the carbon-based particles 4.

The carbon-based particles 4 are, for example, at least one kind of carbon-based particle selected from graphite, carbon black, glassy carbon particles, or milled carbon fibers. Since the carbon-based particles such as graphite, carbon black, glassy carbon particles, or milled carbon fibers have few impurities, are carbon-based like the carbon fibers 2 that constitute the thermal insulation material 10 and the covering layer 6, and have low reactivity, generation of a decomposed gas can be prevented. The glassy carbon particles are obtained by pulverizing non-graphitizable carbon such as a phenol resin carbide. The milled carbon fibers are obtained by pulverizing carbon fibers, and have an average fiber length of, for example, 20 μm to 500 μm.

The carbon-based particles 4 have an average particle diameter of, for example, 10 nm to 500 μm. When the average particle diameter of the carbon-based particles 4 is within this range, a thin base layer 5 can be formed between the carbon fibers 2, and a high level of bonding between the carbon fibers 2 and the covering layer 6 can be ensured in the thermal insulation material 10 as a finished product. In addition, it is possible to prevent the thickness of the base layer 5 from being too large, which tends to increase heat conduction. Note that the average particle diameter can be measured with a laser diffraction particle size analyzer.

Most components of the slurry containing the carbon-based particles 4 are filtered at the surface of the molded body 3 during impregnation, remain at the surface, and hardly enter the interior of the molded body 3. Therefore, in the subsequent CVD step, the components of the slurry remaining at the surface prevent a raw material gas from entering the molded body 3, and the covering layer 6 can be formed only at the surface of the thermal insulation material 10.

The slurry used in the base layer forming step contains the carbon-based particles 4 and a solvent, and may further contain a binder. When the slurry contains a binder, the carbon-based particles 4 unevenly distributed at the surface can be prevented from falling off.

The impregnation with the slurry may not be carried out once but may be carried out multiple times. For example, it is possible to use a process of impregnation with the carbon-based particles 4 and a solvent in the first impregnation and impregnation with the solvent and a binder in the second impregnation. By going through such a process, the binder can be prevented from penetrating the inside of the thermal insulation material 10 and a decrease in thermal insulation performance can be prevented.

The type of the binder for the slurry is not particularly limited, and one that dissolves in a solvent, fine particles that are dispersed in a solvent, or the like can be used.

For example, the binder can be either a binder to be carbonized by heating or a binder that leaves no residue by depolymerization or the like. With the binder to be carbonized, the carbon-based particles 4 can be prevented from falling off even after the covering layer 6 is formed, and a phenol resin, PVA, pitch, or the like can be used as the binder to be carbonized. In addition, with the binder to be carbonized, the carbon-based particles 4 can be prevented from falling off during handling before entering the CVD furnace later.

The impregnation with the slurry in the base layer forming step is desirably carried out in such a way that the carbon fibers 2 remain at the surface even after the impregnation, and the remaining carbon fibers 2 are exposed. When the carbon fibers 2 are exposed at the surface of the base layer 5, the covering layer 6 to be formed in the subsequent CVD step is directly bonded to the carbon fibers 2. Therefore, it is possible to strengthen a bonding force between the thermal insulation material 10 and the covering layer 6, making it difficult for the covering layer 6 to peel off.

The base layer 5 has a thickness of, for example, 10 μm to 500 μm. When the thickness of the base layer 5 is 500 μm or less, a decrease in thermal insulation performance can be prevented. When the thickness of the base layer 5 is 10 μm or more, the covering layer 6 can be prevented from penetrating a main body of the thermal insulation material 10.

Note that in the base layer forming step, a solution of a binder that is a carbon precursor can further be used. Simultaneously with the impregnation with the slurry or after the impregnation with the slurry, the surface of the molded body 3 is impregnated with the solution of the carbon precursor and then dried to immobilize the carbon-based particles and the carbon fibers. Thereafter, the carbon precursor is carbonized in a furnace with an inert atmosphere, whereby a carbon-based adhesive for bonding the carbon-based particles 4 and the carbon fibers 2 can be formed. Note that the carbonization temperature is not particularly limited, and is, for example, 700° C. to 1500° C.

Through the above steps, since the carbon-based particles 4 and the carbon fibers 2 are bonded to each other with the carbon-based adhesive, delamination of the base layer can be prevented and a strong bonding force can be imparted to the covering layer 6.

As shown in FIG. 1B and FIG. 1C, in the CVD step, the molded body 3 including the base layer 5 containing the carbon-based particles 4 at the surface is charged into a CVD furnace and heated, and a raw material gas is introduced thereto, to form the covering layer 6 on the surface of the molded body 3.

Conditions in the CVD are not particularly limited. As the raw material gas, hydrocarbon gases can be used, and for example, methane, ethane, propane, and ethylene can be used. The temperature in the CVD is desirably 800° C. to 2000° C., for example. When the temperature is 800° C. or higher, the raw material gas can be easily decomposed. When the temperature is 2000° C. or lower, sublimation of the carbon fibers 2 is prevented and deterioration can be prevented. In the case of carbonaceous carbon fibers 2, it is further desirable that the temperature is 1700° C. or lower. When being exposed to a high temperature, the carbonaceous carbon fibers 2 are changed into graphitic carbon fibers, resulting in deterioration such as an increase in thermal conductivity. When the CVD is carried out at a temperature of 1700° C. or lower, the thermal insulation property of the molded body 3 of the carbon fibers 2 can be maintained.

As described above, since in the thermal insulation material 10 according to the embodiment, the covering layer 6 containing dense pyrolytic carbon covers the thermal insulation material 10 using the carbon fibers 2, diffusion of the carbon fibers 2 as particles to the outside is prevented. In addition, since the base layer 5 of the thermal insulation material 10 contains the carbon-based particles 4, the covering layer 6 containing pyrolytic carbon is prevented from entering the main body of the thermal insulation material 10 containing the carbon fibers 2, and a decrease in thermal insulation performance can be prevented.

As described above, in the method for producing a thermal insulation material according to the embodiment, the covering layer 6 containing pyrolytic carbon is formed on the base layer 5 by the CVD step. Therefore, since the covering layer 6 containing dense pyrolytic carbon covers the thermal insulation material 10 using the carbon fibers 2, diffusion of the carbon fibers 2 as particles to the outside is prevented. In addition, since in the present production method, the base layer 5 contains the carbon-based particles 4 by the base layer forming step, the covering layer 6 containing pyrolytic carbon is prevented from entering the main body of the thermal insulation material 10 containing the carbon fibers 2, and a decrease in thermal insulation performance can be prevented.

EXAMPLES

Figure 2:
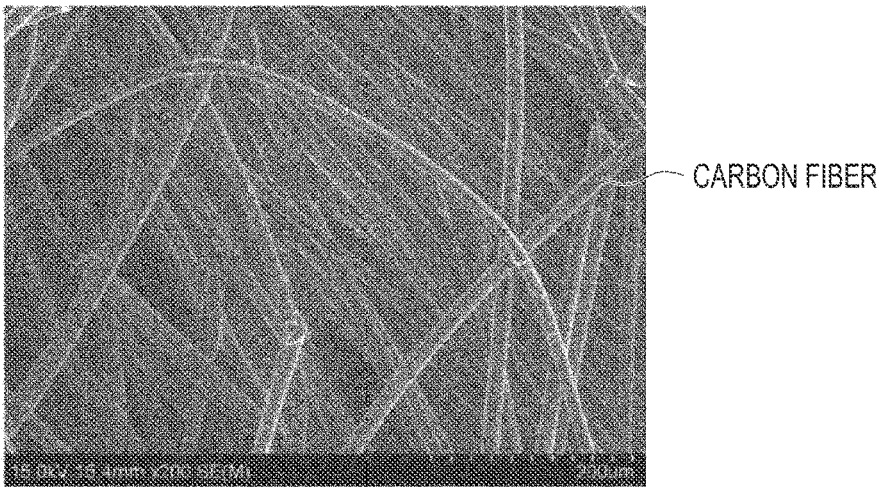
FIG. 2 shows a scanning electron micrograph of a molded body of carbon fibers before a base layer forming step in a method for producing a thermal insulation material in Examples.

A mat of carbon fibers (50×50×10 mm) was prepared, a binder was sprayed onto the mat, and then the mat was heated to 1000° C. to carbonize the binder to form a molded body. FIG. 2 shows a scanning electron micrograph of a surface of the molded body.

The surface of the molded body was processed and shaped, then the surface was coated with a slurry containing a binder and carbon-based particles to form a base layer containing carbon-based particles on the surface of the molded body. Note that graphite particles having an average particle diameter of 10 μm were used as the carbon-based particles.

The molded body formed with the base layer was charged into a furnace in a reducing atmosphere to carbonize the binder. The carbonized binder bonds the carbon-based particles to each other and prevents the particles from falling off.

Figure 3:
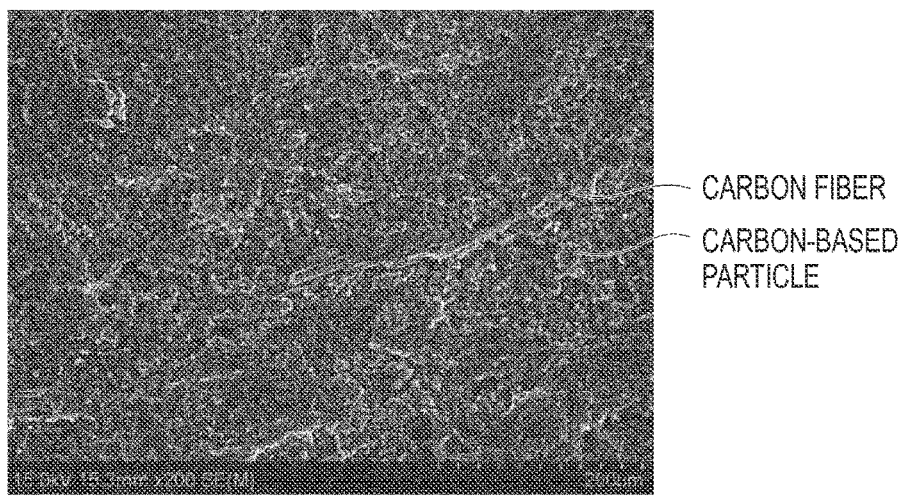
FIG. 3 shows a scanning electron micrograph of a surface after the base layer forming step in the method for producing a thermal insulation material in Examples.

FIG. 3 shows a scanning electron micrograph of a surface of the molded body formed with the base layer. Gaps in the molded body of carbon fibers are filled with the carbon-based particles. In addition, a part of the carbon fibers is exposed at the surface.

The molded body formed with the base layer was charged in a CVD furnace, and a covering layer was formed on the surface. The molded body was placed on a support pin, and the covering layer was formed in a state of being point-supported by the support pin. Since the molded body is point-supported, a covering layer containing pyrolytic carbon can be simultaneously formed on almost the entire surface of the molded body.

The CVD furnace was once evacuated to lower the atmospheric pressure in the furnace, and then a raw material gas was introduced to form a covering layer as a pyrolytic carbon layer.

Since the base layer is formed on the surface of the molded body, the raw material gas does not penetrate the inside of the molded body in the CVD step and is deposited on the surface. At this time, the carbon fibers exposed at the surface serve as anchors to firmly connect the molded body of the carbon fibers and the covering layer.

Figure 4:
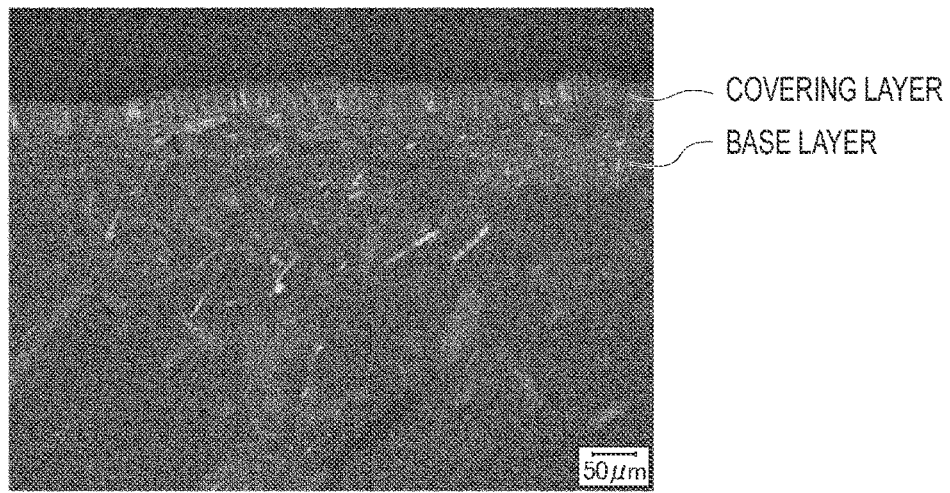
FIG. 4 shows a polarized light micrograph of a cross section of a thermal insulation material in Examples.

FIG. 4 shows a cross-sectional view of a thermal insulation material obtained in Examples. Since a covering layer having a thickness of about 50 μm is formed at the surface and a base layer having a thickness of about 100 μm is directly below, pyrolytic carbon does not enter between the carbon fibers in the main body of the thermal insulation material, and the covering layer is formed only at the surface layer.

Although various embodiments have been described above with reference to the drawings, it is needless to say that the present invention is not limited to such examples. It is apparent to those skilled in the art that various changes and modifications can be conceived within the scope of the claims, and it is understood that such changes and modifications are also encompassed within the technical scope of the present invention. In addition, the constituent elements in the above embodiments may be freely combined without departing from the gist of the present invention.

Note that the present application is based on a Japanese patent application (Japanese Patent Application No. 2021-

124661) filed on Jul. 29, 2021, and the contents thereof are incorporated herein by reference.

REFERENCE SIGNS LIST

2 carbon fiber
3 molded body
4 carbon-based particles
5 base layer
6 covering layer
10 thermal insulation material

The invention claimed is:

1. A thermal insulation material,
comprising:
a covering layer containing pyrolytic carbon at a surface of the thermal insulation material; and
a base layer below the covering layer, the base layer containing carbon fibers and carbon-based particles between the carbon fibers,
wherein the pyrolytic carbon of the covering layer directly bonds to the carbon fibers exposed at a surface of the base layer, and the carbon-based particles and the carbon fibers in the base layer are bonded to each other with a carbon-based adhesive.

2. The thermal insulation material according to claim 1, wherein the carbon fibers constitute a mat or a papermaking product.

3. The thermal insulation material according to claim 1, wherein the carbon-based particles are at least one kind of carbon-based particle selected from graphite, carbon black, glassy carbon particles, or milled carbon fibers.

4. The thermal insulation material according to claim 1, wherein the carbon-based particles have an average particle diameter of 10 nm to 500 μm.

5. The thermal insulation material according to claim 1, wherein the base layer has a thickness of 10 μm to 500 μm.

6. A method for producing a thermal insulation material, comprising:
forming a base layer by impregnating a surface of a molded body containing carbon fibers with a slurry containing carbon-based particles; and
forming a covering layer containing pyrolytic carbon on the base layer by applying a chemical vapor deposition method to the molded body in a CVD furnace,
wherein the pyrolytic carbon of the covering layer directly bonds to the carbon fibers exposed at a surface of the base layer, and the carbon-based particles and the carbon fibers in the base layer are bonded to each other with a carbon-based adhesive.

7. The method for producing a thermal insulation material according to claim 6, wherein in the base layer forming step, a carbon-based adhesive bonding the carbon-based particles and the carbon fibers is formed by impregnating the surface of the molded body with a solution including a carbon precursor simultaneously with or after the impregnation of the slurry, immobilizing the carbon-based particles and the carbon fibers, and carbonizing the carbon precursor.

8. The method for producing a thermal insulation material according to claim 6, wherein the carbon fibers constitute a mat or a papermaking product.

9. The method for producing a thermal insulation material according to claim 6, wherein the carbon-based particles are at least one kind of carbon-based particle selected from graphite, carbon black, glassy carbon particles, or milled carbon fibers.

10. The method for producing a thermal insulation material according to claim 6, wherein the carbon-based particles have an average particle diameter of 10 nm to 500 μm.

11. The method for producing a thermal insulation material according to claim 6, wherein the base layer has a thickness of 10 μm to 500 μm.

* * * * *